(12) United States Patent
Park

(10) Patent No.: US 9,148,950 B2
(45) Date of Patent: Sep. 29, 2015

(54) BACK PLATE OF FLEXIBLE DISPLAY AND FLEXIBLE DISPLAY TERMINAL HAVING THE SAME

(71) Applicant: Hongseok Park, Seoul (KR)

(72) Inventor: Hongseok Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 339 days.

(21) Appl. No.: 13/732,941

(22) Filed: Jan. 2, 2013

(65) Prior Publication Data

US 2013/0170157 A1 Jul. 4, 2013

(30) Foreign Application Priority Data

Jan. 3, 2012 (KR) .................. 10-2012-0000403

(51) Int. Cl.
| H05K 1/02 | (2006.01) |
| H05K 1/18 | (2006.01) |
| H05K 1/00 | (2006.01) |
| H05K 1/14 | (2006.01) |
| H04M 1/02 | (2006.01) |

(52) U.S. Cl.
CPC ............ *H05K 1/028* (2013.01); *H04M 1/0268* (2013.01); *H05K 1/00* (2013.01); *H05K 1/02* (2013.01); *H05K 1/0278* (2013.01); *H05K 1/147* (2013.01); *H05K 1/148* (2013.01); *H05K 1/181* (2013.01); *H05K 2201/09027* (2013.01)

(58) Field of Classification Search
CPC ........... H05K 1/028; H05K 1/00; H05K 1/02; H05K 1/181
USPC .................. 361/749, 767, 760, 769; 174/254, 174/260–261; 257/669
See application file for complete search history.

(56) References Cited

U.S. PATENT DOCUMENTS

2011/0088925 A1* 4/2011 Tatsumi et al. ................ 174/69
2011/0242771 A1* 10/2011 Bhattacharya et al. ....... 361/733

* cited by examiner

*Primary Examiner* — Jenny L Wagner
*Assistant Examiner* — Michael P McFadden
(74) *Attorney, Agent, or Firm* — KED & Associates, LLP

(57) ABSTRACT

A back plate arranged at a back surface of a flexible display of a flexible display terminal is provided. The back plate may include a substrate with divided regions having similar displacements, so that when the flexible display is deformed, a plurality of divided plates are formed. A connected part formed of a flexible material may connect the divided plates with each other, and may be deformable in response deformation of the flexible display.

24 Claims, 12 Drawing Sheets

BACK PLATE OF FLEXIBLE DISPLAY AND FLEXIBLE DISPLAY TERMINAL HAVING THE SAME

CROSS-REFERENCE TO RELATED APPLICATION(S)

This application claims priority under 35 U.S.C. §119 to Korean Application No. 10-2012-0000403 filed on Jan. 3, 2012, whose entire disclosure is hereby incorporated by reference.

BACKGROUND

1. Field

This relates to a back plate that is able to be distorted or bent, corresponding to bending or distortion of a flexible display, and a flexible display terminal including the same.

2. Background

Recently, displays have been developed that are flexible in response to an external force, and studies on application of such flexible displays to display devices have been actively in progress. Such flexible displays may be adapted as displays for display terminals having improved portability and mobility.

Generally, terminals can be classified into mobile terminals and stationary terminals. In addition, mobile terminals can be further classified into handheld terminals and vehicle mount terminals.

A mobile terminal is a device which may be configured to perform various functions such as data and voice communications, capturing images and video via a camera, recording audio, playing music files and outputting music via a speaker system, and displaying images and video on a display.

In an effort to increase functionality of mobile terminals, software and hardware improvements, as well as changes and improvements in the structural components, may be considered for the mobile terminal.

BRIEF DESCRIPTION OF THE DRAWINGS

The embodiments will be described in detail with reference to the following drawings in which like reference numerals refer to like elements wherein.

DETAILED DESCRIPTION

In the following detailed description, reference is made to the accompanying drawing figures which form a part hereof, and which show by way of illustration various embodiments.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

The various features described herein may be applicable to a various types of mobile terminals. Examples of such terminals may include mobile phones, user equipment, smart phones, digital broadcast receivers, personal digital assistants, laptop computers, portable multimedia players (PMP), navigators and the like.

Yet, it is apparent to those skilled in the art that a configuration according to an embodiment disclosed in this specification may also be applicable to a fixed terminal such as a digital TV, a desktop computer and the like, as well as a mobile terminal.

Figure 1:
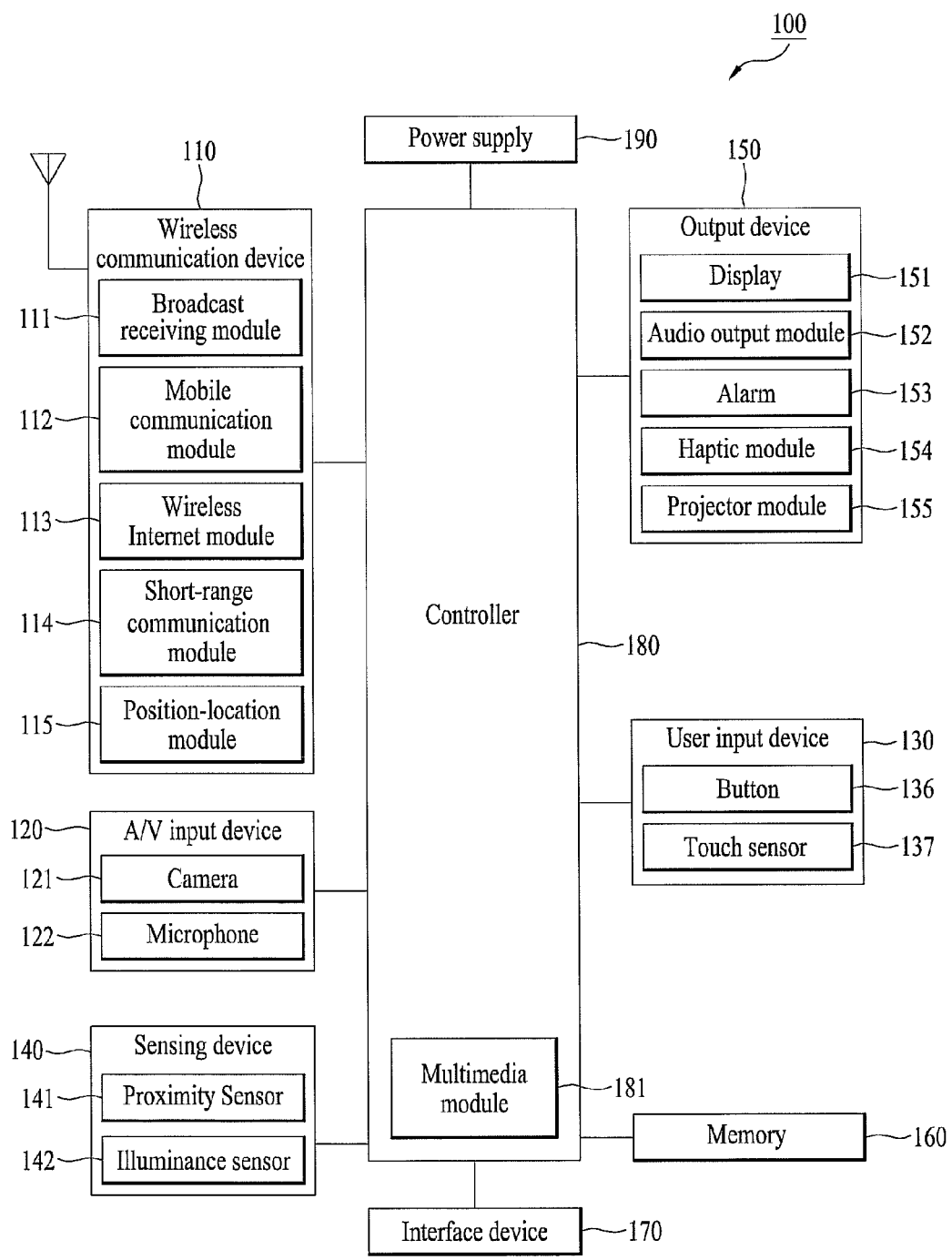
FIG. 1 is a block diagram of a flexible display terminal according to an embodiment as broadly described herein.

FIG. 1 is a block diagram of a mobile terminal 100 in accordance with an embodiment as broadly described herein. The mobile terminal 100 may include a wireless communication device 110, an A/V (audio/video) input device 120, a user input device 130, a sensing device 140, an output device 150, a memory 160, an interface device 170, a controller 180, a power supply 190 and the like. FIG. 1 shows the mobile terminal 100 having various components, but it is understood that implementing all of the illustrated components is not a requirement. Greater or fewer components may alternatively be implemented.

In the following description, the above elements of the mobile terminal 100 are explained in sequence.

First of all, the wireless communication device 110 may include one or more components which permits wireless communication between the mobile terminal 100 and a wireless communication system or network within which the mobile terminal 100 is located. For instance, the wireless communication device 110 can include a broadcast receiving module 111, a mobile communication module 112, a wireless internet module 113, a short-range communication module 114, a position-location module 115 and the like.

The broadcast receiving module 111 receives a broadcast signal and/or broadcast associated information from an external broadcast managing server via a broadcast channel. The broadcast channel may include a satellite channel and a terrestrial channel. At least two broadcast receiving modules 111 can be provided to the mobile terminal 100 in pursuit of simultaneous receptions of at least two broadcast channels or broadcast channel switching facilitation.

The broadcast managing server generally refers to a server which generates and transmits a broadcast signal and/or broadcast associated information or a server which is provided with a previously generated broadcast signal and/or broadcast associated information and then transmits the provided signal or information to a terminal. The broadcast signal may be implemented as a TV broadcast signal, a radio broadcast signal, and a data broadcast signal, among others. If desired, the broadcast signal may further include a broadcast signal combined with a TV or radio broadcast signal.

The broadcast associated information includes information associated with a broadcast channel, a broadcast program, a broadcast service provider, etc. And, the broadcast associated information can be provided via a mobile communication network. In this case, the broadcast associated information can be received by the mobile communication module 112.

The broadcast associated information can be implemented in various forms. For instance, broadcast associated information may include an electronic program guide (EPG) of digital multimedia broadcasting (DMB) and electronic service guide (ESG) of digital video broadcast-handheld (DVB-H).

The broadcast receiving module 111 may be configured to receive broadcast signals transmitted from various types of broadcast systems. By nonlimiting example, such broadcasting systems include digital multimedia broadcasting-terrestrial (DMB-T), digital multimedia broadcasting-satellite (DMB-S), digital video broadcast-handheld (DVB-H), Convergence of Broadcasting and Mobile Service (DVB-CBMS), Open Mobile Alliance-BroadCAST (OMA-BCAST), China Multimedia Mobile Broadcasting (CMMB), Mobile Broadcasting Business Management System (MBBMS), the data broadcasting system known as media forward link only (MediaFLO®) and integrated services digital broadcast-terrestrial (ISDB-T). Optionally, the broadcast receiving module 111 can be configured suitable for other broadcasting systems as well as the above-explained digital broadcasting systems.

The broadcast signal and/or broadcast associated information received by the broadcast receiving module 111 may be stored in a suitable device, such as a memory 160.

The mobile communication module 112 transmits/receives wireless signals to/from one or more network entities (e.g., base station, external terminal, server, etc.) via a mobile network such as GSM (Global System for Mobile communications), CDMA (Code Division Multiple Access), WCDMA (Wideband CDMA) and so on. Such wireless signals may represent audio, video, and data according to text/multimedia message transmission and reception, among others.

The wireless Internet module 113 supports Internet access for the mobile terminal 100. This module may be internally or externally coupled to the mobile terminal 100. In this case, the wireless Internet technology can include WLAN (Wireless LAN) (Wi-Fi), Wibro (Wireless broadband), Wimax (World Interoperability for Microwave Access), HSDPA (High Speed Downlink Packet Access), GSM, CDMA, WCDMA, LTE (Long Term Evolution) etc.

Wireless Internet access by Wibro, HSPDA, GSM, CDMA, WCDMA, LTE or the like is achieved via a mobile communication network. In this aspect, the wireless Internet module 113 configured to perform the wireless internet access via the mobile communication network can be understood as a sort of the mobile communication module 112.

The short-range communication module 114 facilitates relatively short-range communications. Suitable technologies for implementing this module include radio frequency identification (RFID), infrared data association (IrDA), ultra-wideband (UWB), as well at the networking technologies commonly referred to as Bluetooth and ZigBee, to name a few.

The position-location module 115 identifies or otherwise obtains the location of the mobile terminal 100. If desired, this module may be implemented with a global positioning system (GPS) module. According to the current technology, the GPS module 115 is able to precisely calculate current 3-dimensional position information based on at least one of longitude, latitude and altitude and direction (or orientation) by calculating distance information and precise time information from at least three satellites and then applying triangulation to the calculated information. Currently, location and time information are calculated using three satellites, and errors of the calculated location position and time information are then amended using another satellite. Besides, the GPS module 115 is able to calculate speed information by continuously calculating a real-time current location.

Referring to FIG. 1, the audio/video (A/V) device 120 may be configured to provide audio or video signal input to the mobile terminal 100. As shown, the A/V input device 120 includes a camera 121 and a microphone 122. The camera 121 receives and processes image frames of still pictures or video, which are obtained by an image sensor in a video call mode or a photographing mode. In addition, the processed image frames can be displayed on the display 151 of the output device 150.

The image frames processed by the camera 121 can be stored in the memory 160 or can be externally transmitted via the wireless communication device 110. Optionally, at least two cameras 121 can be provided to the mobile terminal 100 according to environment of usage.

The microphone 122 receives an external audio signal while the portable device is in a particular mode, such as phone call mode, recording mode and voice recognition. This audio signal is processed and converted into electric audio data. The processed audio data is transformed into a format transmittable to a mobile communication base station via the mobile communication module 112 in case of a call mode. The microphone 122 may include assorted noise removing algorithms to remove noise generated in the course of receiving the external audio signal.

The user input device 130 may generate input data responsive to user manipulation of an associated input device or devices. Examples of such devices may include a button 136 provided to front/rear/lateral side of the mobile terminal 100 and a touch sensor (pressure sensitive touch/capacitive touch) 137 and may further include a key pad, a dome switch, a jog wheel, a jog switch and the like.

The sensing device 140 may provide sensing signals for controlling operations of the mobile terminal 100 using status measurements of various aspects of the mobile terminal 100. For instance, the sensing device 140 may detect an open/close status of the mobile terminal 100, relative positioning of components (e.g., a display and keypad) of the mobile terminal 100, a change of position of the mobile terminal 100 or a component of the mobile terminal 100, a presence or absence of user contact with the mobile terminal 100, orientation or acceleration/deceleration of the mobile terminal 100. By nonlimiting example, such a sensing device 140 may include a gyro sensor, an acceleration sensor, a geomagnetic sensor and the like.

As an example, consider the mobile terminal 100 being configured as a slide-type mobile terminal. In this configuration, the sensing device 140 may sense whether a sliding portion of the mobile terminal is open or closed. Other examples include the sensing device 140 sensing the presence or absence of power provided by the power supply 190, the presence or absence of a coupling or other connection between the interface device 170 and an external device. In addition, the sensing device 140 may include a proximity sensor 141.

The output device 150 may generate outputs relevant to the senses of sight, hearing, touch and the like. The output device 150 includes the display 151, an audio output module 152, an alarm 153, and a haptic module 154 and the like.

The display 151 may be implemented to visually display (output) information associated with the mobile terminal 100. For instance, if the mobile terminal is operating in a phone call mode, the display may provide a user interface (UI) or graphical user interface (GUI) which includes information associated with placing, conducting, and terminating a phone call. As another example, if the mobile terminal 100 is in a video call mode or a photographing mode, the display 151 may additionally or alternatively display images which are associated with these modes, the UI or the GUI.

In embodiments as broadly described herein, a flexible display is used as the display 151 and the flexible display may be deformable by the user.

At least two displays 151 may be provided to the mobile terminal 100 in accordance with the implemented configuration of the mobile terminal 100. For instance, a plurality of displays may be arranged on a single face of the mobile terminal 100 in a manner of being spaced apart from each other or being built in one body. Alternatively, a plurality of displays may be arranged on different faces of the mobile terminal 100. In a case in which the display 151 and the touch sensor 137 configure a mutual layer structure (hereinafter called 'touch screen'), the display 151 may be used as an input device as well as an output device. In this case, the touch sensor may be configured as a touch film, a touch sheet, a touchpad or the like.

The touch sensor 137 may convert a pressure applied to a specific portion of the display 151 or a variation of a capacitance generated from a specific portion of the display 151 to an electric input signal. Moreover, the touch sensor 137 may detect a pressure of a touch as well as a touched position or size.

If a touch input is made to the touch sensor 137, signal(s) corresponding to the touch is transferred to a touch controller. The touch controller processes the signal(s) and then transfers the processed signal(s) to the controller 180. Therefore, the controller 180 is able to know whether a prescribed portion of the display 151 is touched.

The proximity sensor 141 may detect a presence or non-presence of an object approaching a prescribed detecting surface or an object existing around the proximity sensor 141 using an electromagnetic field strength or infrared ray without mechanical contact. Hence, the proximity sensor 141 may have greater durability and wider utility than that of a contact type sensor.

The proximity sensor 141 may be one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor and the like. In case that the touchscreen includes the electrostatic capacity proximity sensor, it is configured to detect the proximity of a pointer using a variation of electric field according to the proximity of the pointer. In this case, the touchscreen (touch sensor) can be classified as the proximity sensor.

For clarity and convenience of the following description, as a pointer becomes proximate to a touchscreen without coming into contact with the touchscreen, if the pointer is perceived as situated over the touchscreen, such an action shall be referred to as a 'proximity touch'. If a pointer actually comes into contact with a touchscreen, such an action shall be referred to as a 'contact touch'. A proximity-touched position over the touchscreen with the pointer may refer to a position at which the pointer vertically opposes the touchscreen when the touchscreen is proximity-touched with the pointer.

The proximity sensor 141 detects a proximity touch and a proximity touch pattern (e.g., a proximity touch distance, a proximity touch duration, a proximity touch position, a proximity touch shift state, etc.). In addition, information corresponding to the detected proximity touch action and the detected proximity touch pattern can be outputted to the touchscreen.

The audio output module 152 functions in various modes including a call-receiving mode, a call-placing mode, a recording mode, a voice recognition mode, a broadcast reception mode and the like to output audio data which is received from the wireless communication device 110 or is stored in the memory 160. During operation, the audio output module 152 outputs audio relating to a particular function (e.g., call received, message received, etc.). The audio output module 152 is often implemented using one or more speakers, buzzers, other audio producing devices, and combinations thereof.

The alarm 153 may output a signal for announcing the occurrence of a particular event associated with the mobile terminal 100. Typical events include a call received event, a message received event and a touch input received event. The alarm 153 may output a signal for announcing the event occurrence by way of vibration as well as video or audio signal. The video or audio signal can be output via the display 151 or the audio output device 152. Hence, the display 151 or the audio output module 152 can be regarded as a part of the alarm 153.

The haptic module 154 generates various tactile effects that can be sensed by a user. Vibration is a representative one of the tactile effects generated by the haptic module 154. Strength and pattern of the vibration generated by the haptic module 154 are controllable. For instance, different vibrations can be output in a manner of being synthesized together or can be output in sequence.

The haptic module 154 is able to generate various tactile effects as well as the vibration. For instance, the haptic module 154 generates the effect attributed to the arrangement of pins vertically moving against a contact skin surface, the effect attributed to the injection/suction power of air though an injection/suction hole, the effect attributed to the skim over a skin surface, the effect attributed to the contact with electrode, the effect attributed to the electrostatic force, the effect attributed to the representation of hold/cold sense using an endothermic or exothermic device and the like.

The haptic module 154 can be implemented to enable a user to sense the tactile effect through a muscle sense of finger, arm or the like as well as to transfer the tactile effect through a direct contact. In certain embodiments, at least two haptic modules 154 may be provided to the mobile terminal 100 in accordance with the corresponding configuration type of the mobile terminal 100.

The memory 160 may store various types of data to support the processing, control, and storage requirements of the mobile terminal 100. Examples of such data include program instructions for applications operating on the mobile terminal 100, contact data, phonebook data, messages, audio, still pictures (or photo), moving pictures, etc. In addition, a recent use history or a cumulative use frequency of each data (e.g., use frequency for each phonebook, each message or each multimedia) can be stored in the memory 160. Moreover, data for various patterns of vibration and/or sound output in case of a touch input to the touchscreen can be stored in the memory 160.

The memory 160 may be implemented using any type or combination of suitable volatile and non-volatile memory or storage devices including hard disk, random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, multimedia card micro type memory, card-type memory (e.g., SD memory, XD memory, etc.), or other similar memory or data storage device. In addition, the mobile terminal 100 is able to operate in association with web storage for performing a storage function of the memory 160 on the Internet.

The interface device 170 may couple the mobile terminal 100 with external devices. The interface device 170 receives data from the external devices or is supplied with the power and then transfers the data or power to the respective elements of the mobile terminal 100 or enables data within the mobile terminal 100 to be transferred to the external devices.

The interface device 170 may be configured using a wired/wireless headset port, an external charger port, a wired/wireless data port, a memory card port, a port for coupling to a device having an identity module, audio input/output ports, video input/output ports, an earphone port and/or the like.

The identity module is the chip for storing various kinds of information for authenticating a use authority of the mobile terminal 100 and can include User Identify Module (UIM), Subscriber Identify Module (SIM), Universal Subscriber Identity Module (USIM) and/or the like. A device having the identity module (hereinafter called 'identity device') can be manufactured as a smart card. Therefore, the identity device is connectible to the mobile terminal 100 via the corresponding port.

When the mobile terminal 100 is connected to an external cradle, the interface device 170 becomes a passage for supplying the mobile terminal 100 with power from the cradle or a passage for delivering various command signals input from the cradle by a user to the mobile terminal 100. Each of the various command signals input from the cradle, or the power, can operate as a signal enabling the mobile terminal 100 to recognize that it is correctly loaded in the cradle.

The controller 180 may control the overall operations of the mobile terminal 100. For example, the controller 180 may perform the control and processing associated with voice calls, data communications, video calls, etc. The controller 180 may include a multimedia module 181 that provides multimedia playback. The multimedia module 181 may be configured as part of the controller 180, or implemented as a separate component.

Moreover, the controller 180 may perform a pattern (or image) recognizing process for recognizing a writing input and a picture drawing input carried out on the touchscreen as characters or images, respectively.

The power supply 190 provides power required by the various components for the mobile terminal 100. The power may be internal power, external power, or combinations thereof.

A battery may include a built-in rechargeable battery and may be detachably attached to the terminal body for a charging and the like. A connecting port may be configured as one example of the interface device 170 via which an external charger for supplying a power of a battery charging is electrically connected.

Various embodiments described herein may be implemented in a computer-readable medium using, for example, computer software, hardware, or some combination thereof.

For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. Such embodiments may also be implemented by the controller 180.

For a software implementation, the embodiments described herein may be implemented with separate software modules, such as procedures and functions, each of which perform one or more of the functions and operations described herein. The software codes can be implemented with a software application written in any suitable programming language and may be stored in memory such as the memory 160, and executed by a controller or processor, such as the controller 180.

For convenience sake, it is assumed that the mobile terminal which will be described as follows includes at least one of the elements mentioned above, referring to FIG. 1. In particular, a mobile terminal as embodied and broadly described herein may include one or more displays 151 and at least one flexible display.

The flexible display applicable to the display 151 of the mobile terminal according to embodiments will be described as follows.

Such a flexible display refers to a display device formed of a flexible material configured to be bent or folded. In other words, the flexible display may be relatively light and unbreakable display device fabricated on a bendable, curable or rollable substrate, while maintaining display characteristics of a flat panel display. The flexible display will hereinafter be referred to as a flexible display.

Application technologies of such the flexible display may include TFT LCD, EL (OLED), electrophoretic) and LITI (Laser Induced Thermal Image and so on.

In certain embodiments, electronic paper may be used as the flexible display. Such electronic paper is a display device where characteristics of ink and paper are applied, referred to as "e-paper". Different from a flat panel display that uses backlight lighting provided to pixels, such e-paper uses reflected light. Once an image or text is formed in the e-paper, the shape of the image or text can be maintained even without additional power supply.

The flexible display has the characteristics of free shapes and arrangements. In a case in which the flexible display applied to a mobile terminal, the flexible display mentioned above can provide various shapes and functions resulting from such characteristics.

The flexible display 300 provided in the mobile terminal 100 will be described as follows, referring to FIGS. 2 and 3.

Figure 2:
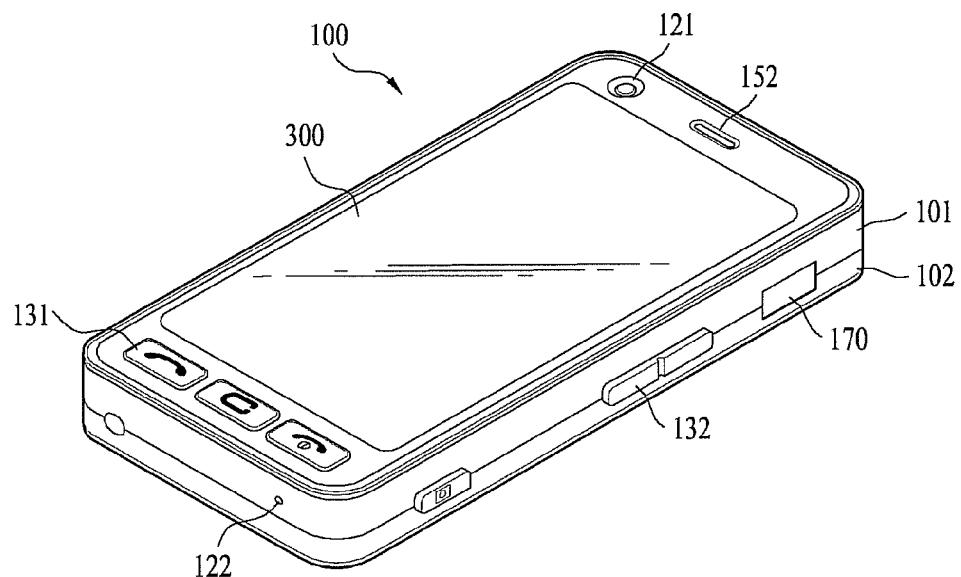
FIG. 2 is a front perspective view of an exemplary flexible display terminal.
Figure 3:
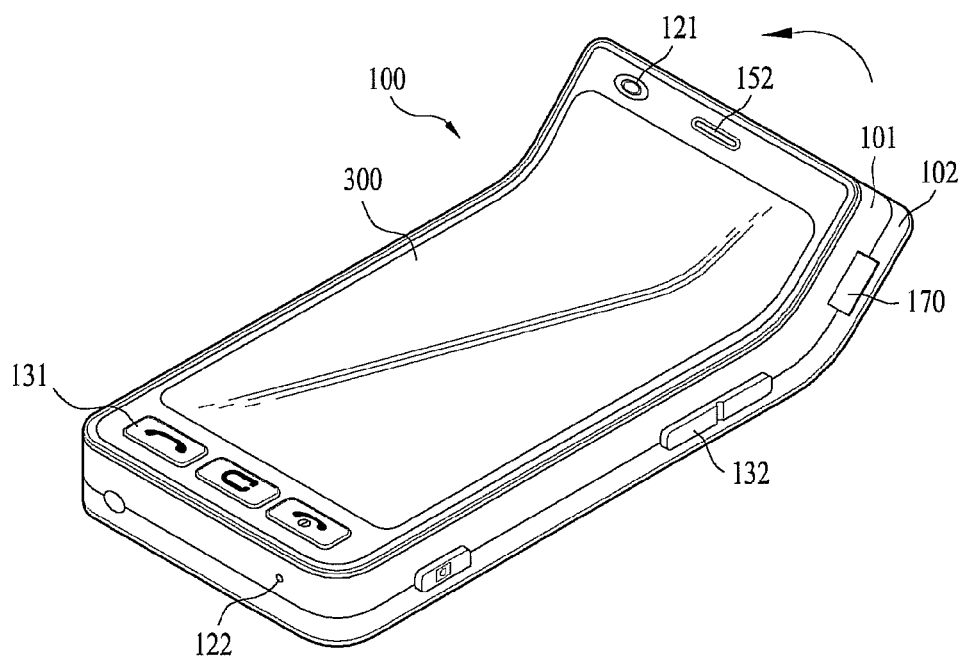
FIG. 3 is a front perspective view of the flexible display terminal shown in FIG. 2, illustrating a certain amount of deformation.

In FIGS. 2 and 3, the flexible display 300 is applied as a display 151 provided in a bar type mobile terminal. In FIG. 3, the flexible display 300 is deformed together with deformation of a body provided in a mobile terminal.

The mobile terminal 100 shown in FIGS. 2 and 3 has a bar type terminal body. Yet, the mobile terminal 100 may be implemented in a variety of different configurations. Examples of such configurations include folder-type, slide-type, rotational-type, swing-type and combinations thereof. For clarity, further disclosure will primarily relate to a bar-type mobile terminal 100. However such teachings apply equally to other types of mobile terminals.

Referring to FIG. 2, the mobile terminal 100 includes a case 101 and 102 configuring an exterior thereof. In the present embodiment, the case can be divided into a front case 101 and a rear case 102. Various electric/electronic parts are loaded in a space provided between the front and rear cases 101 and 102. At least one middle case may be further arranged between the front case 101 and the rear case 102.

The cases 101 and 102 can be formed by injection molding of synthetic resin or can be formed of metal substance such as stainless steel (STS), titanium (Ti) or the like for example.

A flexible display 300, an audio output device 152, a camera 121, user input device 130 (including manipulating devices 131 and 132), a microphone 122 and the like can be provided to the case 101 or 102.

In the embodiment shown in FIGS. 2 and 3, the flexible display 300300 occupies most of a main face of the front case 101. The audio output device 152 and the camera 121 are provided to an area adjacent to one of the two opposite end portions of the flexible display 300, while the manipulating device 131 and the microphone 122 are provided to another area adjacent to the other end portion of the flexible display 300. The manipulating device 132 and the interface device 170 can be provided to lateral sides of the front and rear cases 101 and 102.

The input device 130 is manipulated to receive a command for controlling an operation of the terminal 100. And, the input device 130 may include a plurality of manipulating devices 131 and 132. The manipulating devices 131 and 132 may be referred to as a manipulating portion and may adopt any mechanism of a tactile manner that enables a user to perform a manipulation action by experiencing a tactile feeling.

Content input via the first or second manipulating device 131 or 132 may be diversely set. For instance, such a command as start, end, scroll and the like is input to the first manipulating device 131. In addition, a command for a volume adjustment of sound output from the audio output device 152 and the like can be input to the second manipulating device 132, a command for a switching to a touch recognizing mode of the flexible display 300 and the like can be input to the second manipulating device 132.

Referring to FIG. 3, a deformed shape of a body provided in the bar type mobile terminal mentioned above, when a body is deformed by a driving device provided in the bar type mobile terminal or when an external force is applied to the mobile terminal will be described as follows.

FIG. 3 is a perspective diagram illustrating deformation the body. Referring to FIG. 3, a terminal 100 may have a deformable profile or shape. Accordingly, the profile or shape of the terminal 100 can be physically deformed according to an output signal of a controller 180 or an external force.

The flexible display provided in such a mobile terminal mentioned above is one example, and mobile terminals according to embodiments as broadly described herein are not limited thereto. The mobile terminals may be various types.

A flexible display terminal 100 may be deformable as mentioned above when the user applies an external force. Here, the flexible display may be formed of a flexible material, but it may be difficult to make deformable a back plate 200 mounted to a back surface of the flexible display.

Examples of the back plate 200 may include a printed circuit board (PCB) where electronic components are mounted and a rear case for protecting a rear surface of the flexible display and maintaining the shape of the flexible display terminal.

Such a back plate 200 may not be formed of the same material used in forming the flexible display. Especially, a printed circuit board is an element where a semiconductor chip, a camera module, a memory chip and other various components are mounted and all of the components cannot be formed of flexible materials.

In certain embodiments, the back plate 200 may be provided with a solidity substrate 210 configured of a plurality of divided plates, or boards, 211, 213 and 215 and connected parts 220 formed of a flexible material to connect the divided plates 211, 213 and 215 with each other, such that the back plate 200 may be deformable together with the flexible display.

The plurality of divided plates, or boards, may be divided based on displacements according to the deformation of the flexible display. In other words, when the flexible display is deformed, the solidity substrate 210 is divided based on regions having similar displacements and the divided regions may correspond to the divided plates 211, 213, and 215, respectively.

When regions having similar displacements are formed as the divided plates 211, 213 and 215, one of the divided plates may be moved as far as a deformation degree, namely, a similar displacement. Accordingly, even if the divided plates 211, 213 and 215 are formed of a flexible material, the flexible display terminal 100 may operate.

Embodiments of the back plate 200 in which the solidity substrate 210 is divided according to the deformation of the flexible display will be described as follows.

Figure 4:
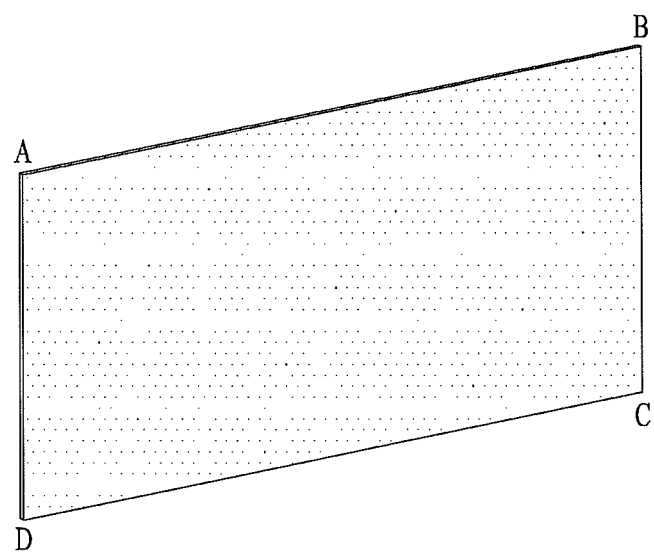
FIG. 4 is a perspective of a flexible display, as embodied and broadly described herein, before deformation.

The flexible display 300 shown in FIG. 4 may be attached to a front surface of the terminal, configured to output video information. The flexible display includes fourth corners (A, B, C and D) and the appearance (namely, profile) is deformable by an external force as mentioned above.

Figure 5:
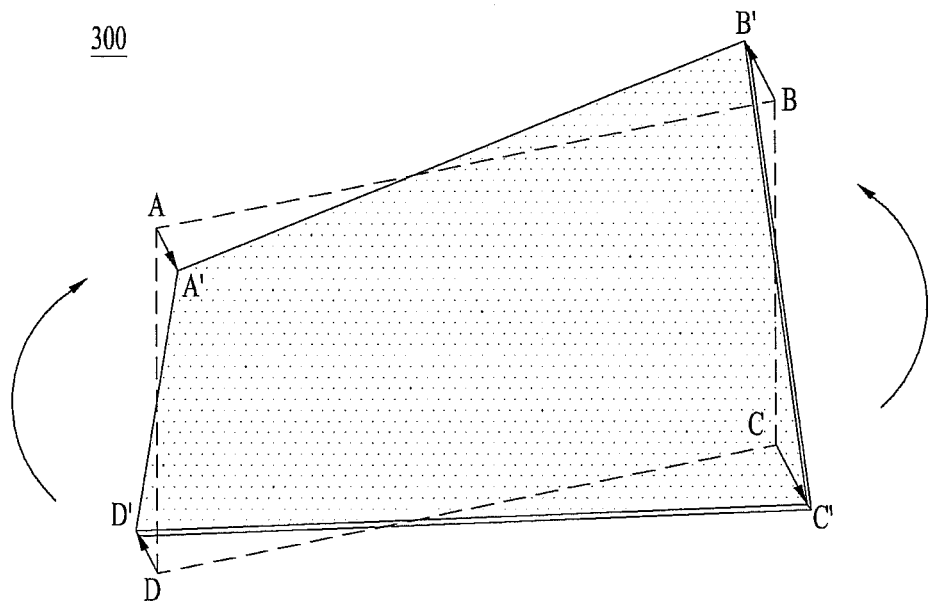
FIG. 5 is a perspective view illustrating distortion of the flexible display shown in FIG. 4.

FIG. 5 is a diagram illustrating the flexible display 300 in a twisted and deformed state. In the drawing, a rotational force is applied to right and left portions in opposite directions and two of the fourth corners located symmetrically are deformed in the same direction.

In other words, a corner (A) is moved backward (A') from an original position and reversely, a corner (D) is moved forward (D') from an original position. A corner (C) is moved backward (C') from an original position and a corner (B) is moved forward (B') from an original position.

Figure 6:
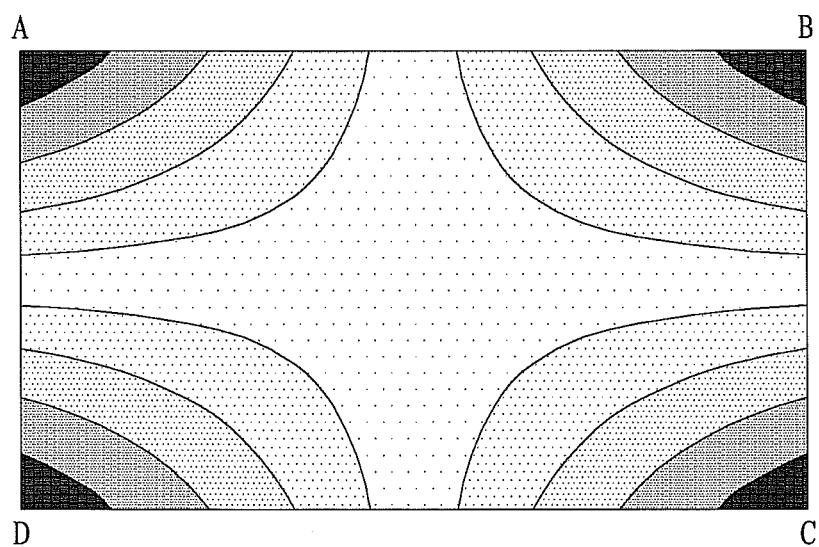
FIG. 6 is a diagram of regions having similar displacements in the flexible display shown in FIG. 4.

FIG. 6 is a diagram illustrating a displacing degree of the flexible display 300 according to the twisting of FIG. 5, with corner regions having the largest displacement and a center region having the smallest displacement. Regions having similar displacements are shown in contour lines. As shown in FIG. 6, neighboring sides are connected from both corners and lines curved toward the center are formed, distant from the corners.

The portion divided by the curved line may be a region having a similar displacement made by the twisting and the darkest shaded portion is corresponding to the largest displacement.

There is little displacement difference between the regions having the similar displacements. Accordingly, when the solidity substrate 210 is connected to neighboring sides to each corner and the curved cut-away lines curved toward the center are distantly formed toward the center from the corner. The solidity substrate 210 can be divided into the plurality of the divided plates 211, 213 and 215 partitioned off by the curved cut lines.

The divided plates 211, 213 and 215 divided by the curved cut lines may consist of a center divided plate and a plurality of corner divided plates. The center divided plate is arranged in a central portion of the back plate 200 and it is partitioned off by four curved cut lines located farthest from the four corners. The plurality of the corner divided substrates may be arranged toward the corners from the center divided plate.

Each of the divided plates may have a similar displacement with respect to the twisting of the flexible display terminal 100 when the flexible display terminal 100 is deformed. Accordingly, even if the divided plates are formed of a flexible material, the flexible display terminal 100 can be deformed as the user desires.

Figure 7:
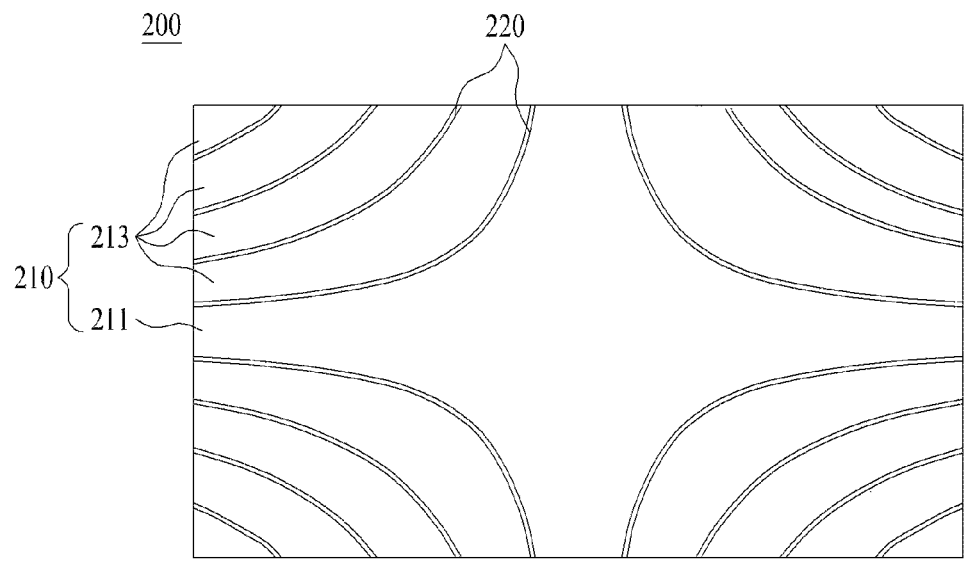
FIGS. 7 and 8 are plane diagrams illustrating a back plate of a flexible display according to an embodiment as broadly described herein.
Figure 8:
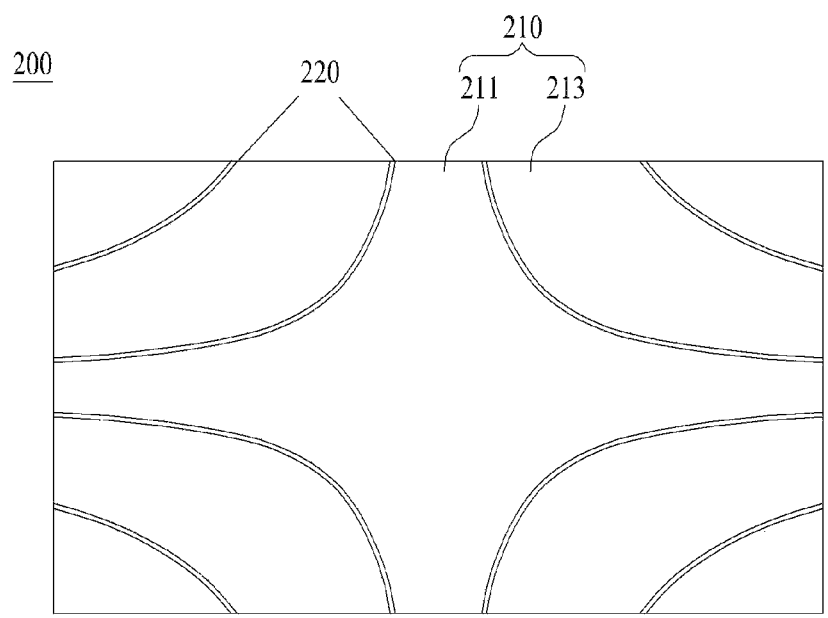

FIG. 8 is a diagram illustrating a smaller number of the divided plates than the divided plates of FIG. 7 and the number of the divided plates can be variable in various ways. Also, the shapes of the divided plates may be symmetrical as shown in FIGS. 7 and 8. However, only a specific corner can be formed larger or smaller, which can be determined based on the deformation of the flexible display terminal 100.

If the number of the divided plates is larger, deformation may be performed more effectively, but it may be more difficult to mount circuit parts 250 on the back plate 200, which may be required of the back plate 200. Accordingly, the number of the divided plates can be adjustable appropriately according to the products.

Figure 9:
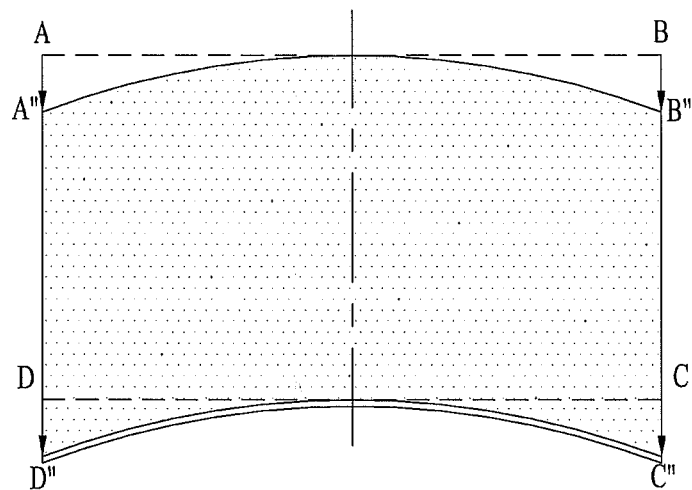
FIG. 9 is a perspective view illustrating a bending phenomenon of a flexible display, as embodied and broadly described herein.

Next, FIG. 9 is a diagram illustrating the deformation of the flexible display when the flexible display is bent and corners (A, B, C and D) have the largest displacement and a center region has the smallest displacement.

Figure 10:
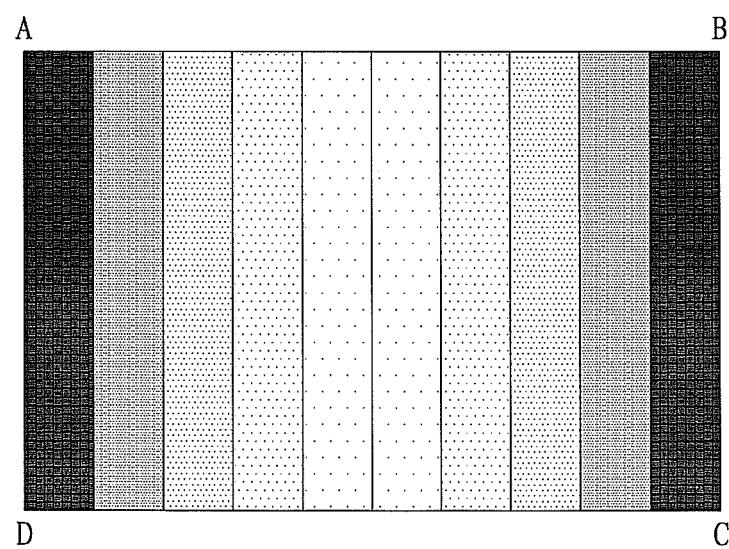
FIG. 10 is a diagram of regions having similar displacements in the flexible display shown in FIG. 9.

FIG. 10 shows the bending deformation of the flexible display that is divided according to similar displacements. Regions having similar displacements are divided, with forming lien symmetry.

Figure 11:
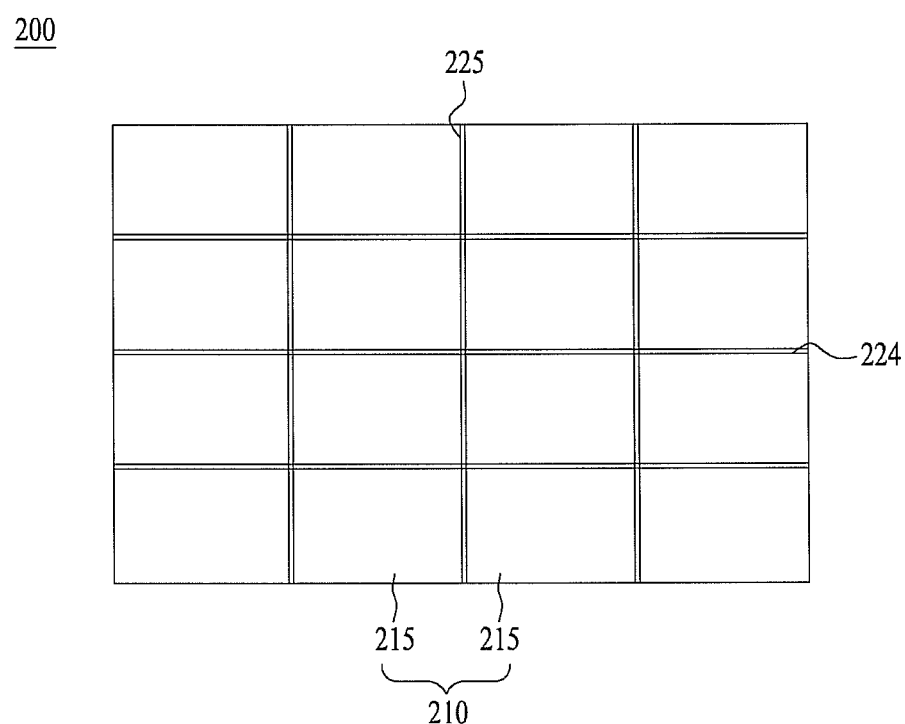
FIGS. 11 to 13 are plane views illustrating a back plate of a flexible display according to an embodiment as broadly described herein.

FIG. 11 is a diagram illustrating regions having similar displacements divided based on the bending deformation. In FIGS. 9 and 10, only vertical bending is shown. Considering horizontal bending, the solidity substrate 210 is partitioned by horizontal and vertical separation horizontal cut lines 224 and vertical cut lines 225 as shown in FIG. 11 to form divided plates 215. The number of the divided plates 215 may be smaller or larger. The size of each divided plate 215 is uniform as shown in FIG. 11. However, the size of the divided plate positioned in a center portion may be different from the sizes of the divided plates positioned in corners.

Figure 12:
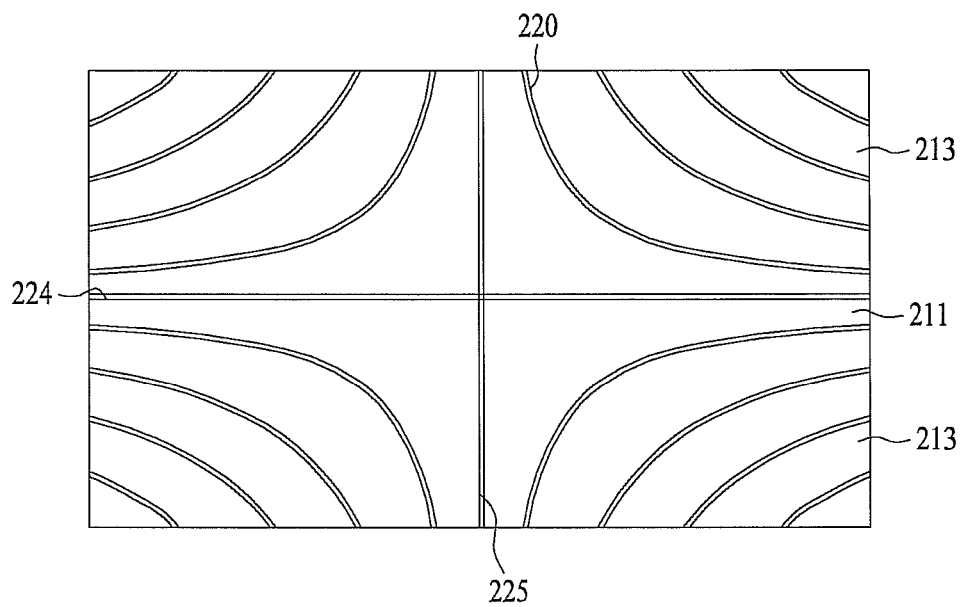
Figure 13:
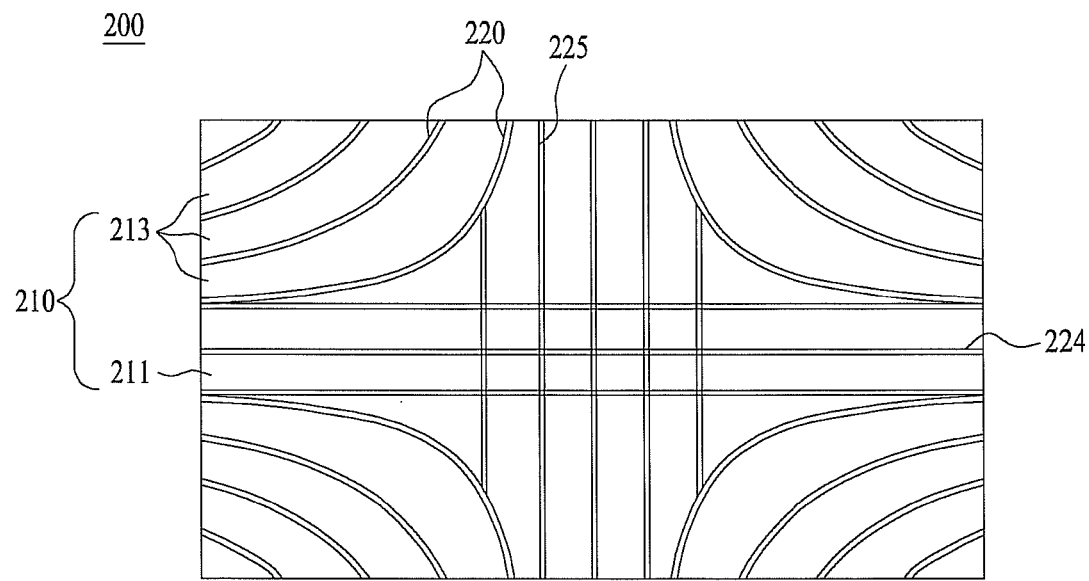

FIGS. 12 and 13 illustrate the back plate, considering both of the bending deformation and twisting deformation. First of all, for the twisting deformation, curved cut-away lines distant from the four corners toward the center are formed to configure a plurality of divided plates 211 and 213.

A center divided plate 211 positioned in the center may be deformable based on the twisted deformation of the flexible display terminal 100, with the center divided plate 211 not deformable based on the bending deformation. For the bending deformation, the center divided plate 211 is divided into fourths along a horizontal cut line 224 and a vertical cut line 225. Four divided plates composing the center divided plate 211 are connected with each other by the connected part 220 formed of a flexible material.

As shown in FIG. 12, one horizontal cut line 224 and one vertical cut line 225 may partition off the center divided plate 211 in a crisscross pattern. Optionally, as shown in FIG. 13, more horizontal and vertical cut lines are provided to form more divided plates.

Figure 14:
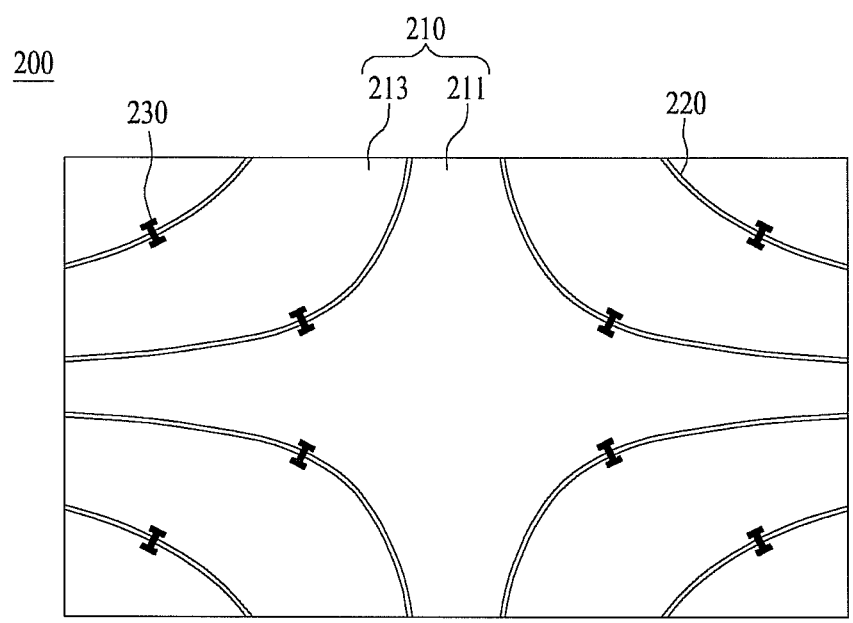
FIG. 14 is a plane view of a connector of the back plate provided in the flexible display according to embodiments as broadly described herein.

FIG. 14 is a plane diagram illustrating a connector 230 of the back plate 200. In case the back plate 200 is a printed circuit board (PCB) where circuit parts 250 including a circuit and a semiconductor element are mounted to control the flexible display, the divided plates 211 and 213 may exchange an electric signal with each other, so a passage for exchanging an electric signal is necessary.

For that, a connector 230 may be provided in the connected part 220 between the divided plates 211 and 213. The connector 230 may be formed of a flexible and conductive material including a flexible printed circuit board (FPCB), a flexible flat cable (FFC) and a wire cable. Such the connector 230 may have a structure that is deformable in a predetermined range and such a structure may include hinge connection and fastening connection.

The connector 230 may also be subject to some deformation, which may be minimized when formed in a region having the smallest displacement. The corners have the largest displacements with respect to the twisting and it thus the connector 230 may be formed in the farthest portion from the corners. In other words, as shown in FIG. 14, the center of each connected part 220 is the region having the smallest displacement and the connector 230 may be formed in the center of the connected part 220.

Figure 15:
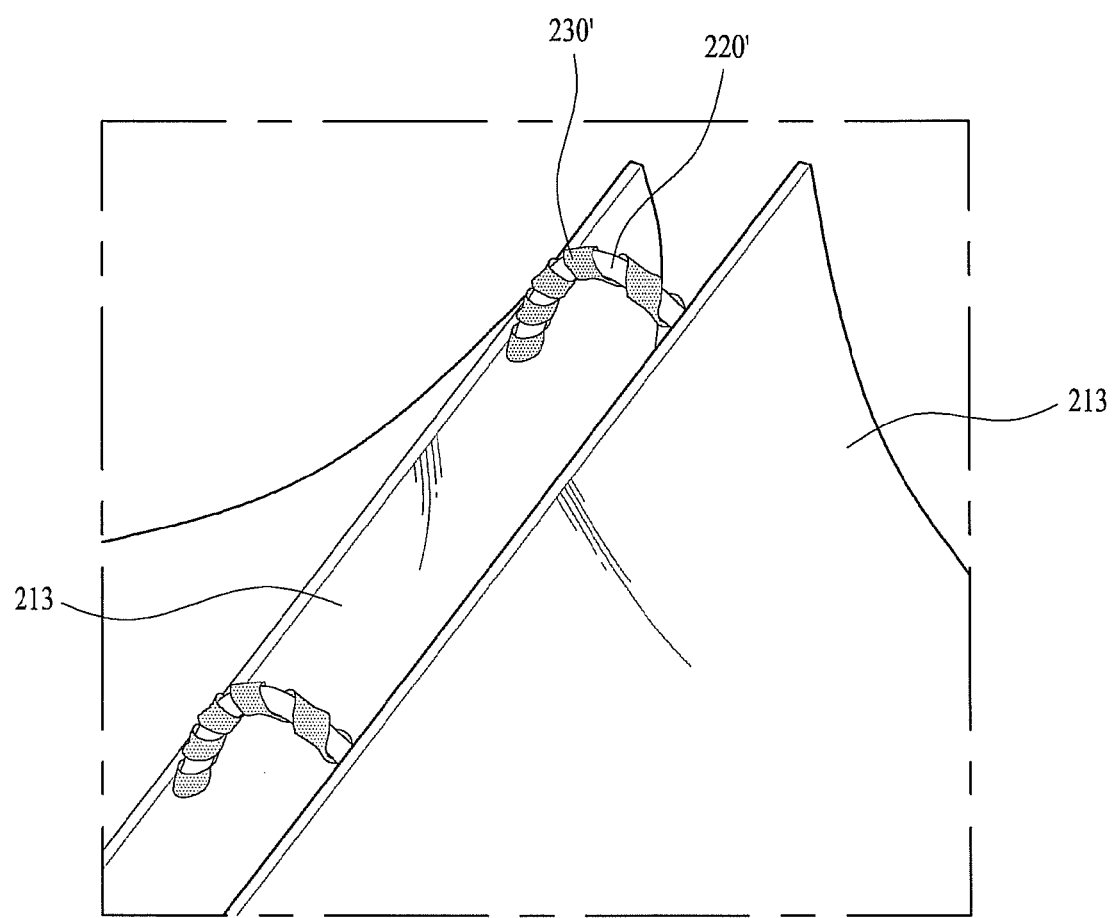
FIG. 15 is a partial perspective view illustrating a connected portion and a connector provided in the back plate of the flexible display according to embodiments as broadly described herein.

FIG. 15 is a partially enlarged diagram illustrating a connected part 220' and a connector 230' according to one embodiment. An elastic bar bendable in all directions may be used as the connected part 220' and a flexible circuit board wound around the elastic bar in spiral direction may be used as the connector 230'.

Such a flexible circuit board can accept the bending deformation along one direction and there is no damage or noise. However, a tension could be partially applied to the flexible circuit board in the twisting deformation and the flexible circuit board could be damaged.

However, even if it is deformed in one direction, the connector 230' according to this embodiment is wound in the spiral shape and a gap between the wound portions of the flexible circuit board is changed enough to accept the deformation. In contrast, the two divided circuit 213 boards directly connected with each other by the flexible printed circuit board according to the embodiment mentioned above might be damaged by the tension applied in the twisting deformation. However, there is no tension applied to the flexible circuit board according to this embodiment and little risks of damage.

Next, in case large-sized parts are used, the structure of the back plate 200 can be changeable. FIG. 15 shows that an opening 240 is formed in the back plate 200 and such an opening 240 is formed in/between the plurality of the divided plates 211 and 213. In other words, the opening 240 may be configured to mount a large-sized part such as a camera module therein.

Figure 16:
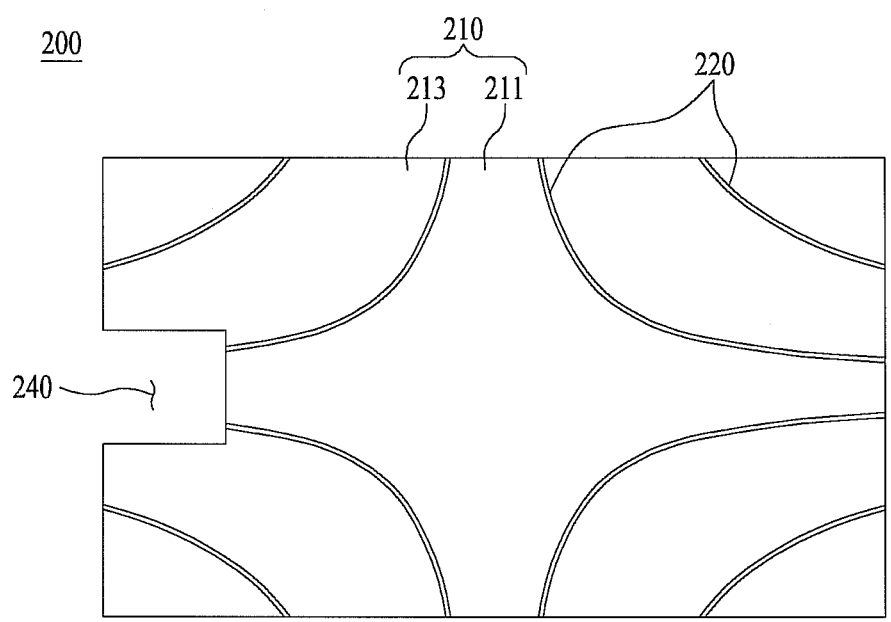
FIGS. 16 to 18 illustrate structure variation for mounting parts composing the back plate of the flexible display.
Figure 17:
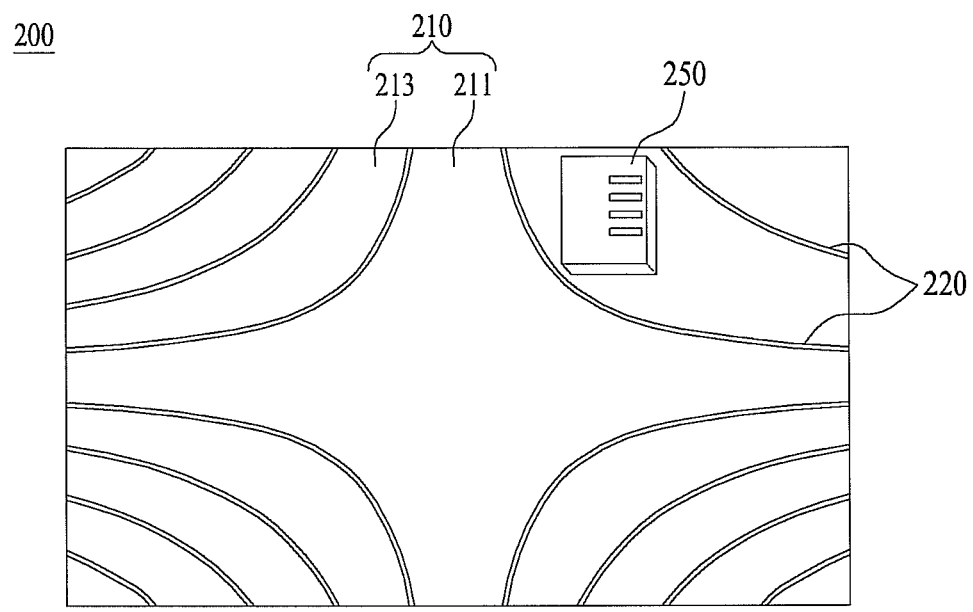

The sizes of specific divided plates 211 and 213 may be enlarged as shown in FIG. 16. The size of each corner divided plate 211 and 213 is uniform and portions where the circuit parts 250 are inserted may be enlarged, corresponding to the sizes of the circuit parts 250. Such a method can be effective in case it is difficult to reduce the size of the part because the size of the part is standardized.

Figure 18:
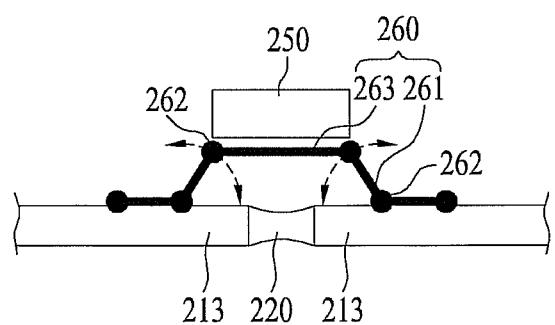

Optionally, a linkage 260 may be useable as shown in FIG. 18. Such a linkage 260 is a mechanism having a plurality of bar-shaped links 261 hingedly coupled to each other to move a coupling part to move the links in a limited range.

The linkage 260 may include a seating portion 263 where the circuit parts 250 are seated and a plurality of links 261 having ends hingedly coupled to the seating part 263 by hinges 262 and the other ends hingedly coupled to the divided plates 211 and 213 by hinges 262.

The seating part 263 provides a predetermined flat space to mount the circuit parts 250 therein and it has the size corresponding to the sizes of the circuit parts 250. An end of each link 261 is coupled to the seating part 263 by hinge 262 and the other end of each link 261 is coupled to each divided plate 211 and 213 by the hinge 262. The seating part 263 is arranged spaced apart a predetermined distance from the divide plates 211 and 213. The links 261 may be coupled to the divided plates 211 and 213, respectively. When the flexible display terminal 100 is deformed, the hinge 262 is rotated and moved to deform the flexible display terminal, with no damage to the circuit parts 250 mounted in the seating part 263.

As mentioned above, the back plate 200 of the flexible display may be deformable according to the deformation of the flexible display 300 and the flexible display terminal usable actually can be realized.

Furthermore, the shape of the back plate 200 may be partially improved according to the parts mounted therein and various parts including a camera and a memory chip can be mounted in the back plate. Accordingly, various functions can be provided to the flexible display terminal 100.

Embodiments as broadly described herein are directed to a back plate of a flexible display and a display terminal including the same, such back plate being deformable corresponding to deformation of a flexible display.

A back surface of a flexible display provided in a flexible display terminal, as embodied and broadly described herein, may include a solidity substrate configured to divide regions having similar displacements, when the flexible display is deformed, to form a plurality of divided plates; and a connected part formed of a flexible material, the connected part configured to connect the divided plates with each other.

The solidity substrate may be rectangular-shaped, and a plurality of cut lines curved toward a center, with connecting neighboring sides with respect to each corner with each other, may be distant from each other toward the center from the corner, and the solidity substrate may include a plurality of divided plates partitioned off by the curved cut lines.

The divided plates may include a center divided plate arranged in a center portion and partitioned off by four curved cut lines located farthest from the four corners; and a plurality of corner divided plates arranged toward the corners from the center divided plate.

The center divided plate may be divided into four plates by horizontal and vertical cut lines formed in a crisscrossed pattern, and the connected part may be formed even between each two of the fourth divided plates. The center divided plate may be partitioned off by a plurality of vertical cut lines and a plurality of horizontal cut lines 224. The number of the corner divided plates may be differentiated for each of the corners. The solidity substrate may include a plurality of divided plates divided by one or more vertical cut lines and one or more horizontal cut lines 224.

The back plate further may include a connector configured to allow an electric signal move between the plurality of divided plates.

The connector may be positioned in a predetermined region having the smallest displacement between the plurality of divided plates, when twisting deformation of the back plate is performed.

The connector may be at least one of a flexible printed circuit board (FPCB), a flexible flat cable (FFC) and a wire cable.

The connected part may be an elastic bar bendable in all directions, and the connector may be a flexible circuit board wound around the elastic bar in a spiral shape.

The flexible circuit board may be wound at predetermined intervals not to be overlapped with the flexible circuit board, when bending deformation of the elastic bar is performed.

The flexible circuit board may include an opening formed via the plurality of the divided plates.

The flexible circuit board may be a printed circuit board (PCB) in which circuit parts comprising a circuit board and a semiconductor device are mounted to control the flexible display.

The back plate may further include a linkage comprising a seating part in which the circuit parts are mounted and a plurality of links having ends hingedly coupled to the seating part and the other ends hingedly coupled to the divided plates, and the links may be hingedly coupled to the divided plates, respectively.

The flexible circuit board may be a rear case that protects the flexible display and covers a back surface of the flexible display terminal.

In another aspect of the present invention, a flexible display terminal includes a flexible display deformable by an external force; and a back plate arranged in a back surface of the flexible display, wherein the back plate comprise a solidity substrate configured to divide regions having similar displacements, when the flexible display is deformed, to form a plurality of divided plates; and a connected part formed of a flexible material, the connected part configured to connect the divided plates with each other.

The back plate of the flexible display according to one embodiment of the present invention may be deformable according to the deformation of the flexible display and the flexible display terminal usable actually can be realized.

Furthermore, the shape of the back plate can be partially improved according to the parts mounted therein and various parts including a camera and a memory chip can be mounted in the back plate. Accordingly, various functions can be provided to the flexible display terminal.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A back plate of a flexible display, the back plate comprising:
a substrate including a plurality of divided regions forming a corresponding plurality of divided plates that are configured to be displaced in response to deformation of the flexible display; and a plurality of connection parts formed of a flexible material and configured to respectively connect adjacent divided plates with each other,
wherein the back plate further comprises a plurality of curved cut lines, each curved cut line extending along a curve toward a center of the back plate.

2. The back plate according to claim 1, each curved cut line connecting neighboring sides of a respective corner of the back plate, the plurality of curved cut lines being spaced apart from each other in an arrangement from each corner toward the center, and wherein the plurality of divided plates are defined by the plurality of curved cut lines.

3. The back plate according to claim 2, wherein the plurality of divided plates comprises:
a center divided plate arranged in a center portion of the back plate and defined by four curved cut lines corresponding to four corners of the substrate; and
a plurality of corner divided plates arranged outside of the center divided plate, each at a position corresponding to one of the four corners of the substrate.

4. The back plate according to claim 3, wherein the center divided plate is divided into four central plates by a horizontal cut line and a vertical cut line that intersect each other at a center portion thereof, and wherein one of the plurality of connection parts is formed between adjacent central plates.

5. The back plate according to claim 3, wherein the center divided plate is partitioned by a plurality of vertical cut lines and a plurality of horizontal cut lines.

6. The back plate according to claim 3, wherein a different size of corner divided plates is formed at least one of the four corners.

7. The back plate according to claim 1, wherein the plurality of divided plates of the substrate is divided by one or more vertical cut lines and one or more horizontal cut lines.

8. The back plate according to claim 1, further comprising:
at least one connector configured to connect two or more of the plurality of divided plates to transmit an electric signal there between.

9. The back plate according to claim 8, wherein the at least one connector is positioned in a predetermined region of a corresponding connection part having the smallest displacement during twisting deformation of the back plate.

10. The back plate according to claim 8, wherein the at least one connector is one of a flexible printed circuit board (FPCB), a flexible flat cable (FFC) or a wire cable.

11. The back plate according to claim 8, wherein at least one of the plurality of connection parts comprises an elastic bar bendable in a plurality of directions and extending between adjacent divided plates, and the at least one connector comprises a flexible circuit board wound around the elastic bar in a spiral shape.

12. The back plate according to claim 11, wherein the flexible circuit board is wound around the elastic bar at predetermined intervals so as to not overlap itself when the elastic bar is bent and deformed.

13. The back plate according to claim 1, wherein the substrate comprises an opening formed via at least one of the plurality of divided plates.

14. The back plate according to claim 1, wherein the substrate is a printed circuit board (PCB) on which circuit parts comprising a circuit board and a semiconductor device are mounted to control the flexible display.

15. The back plate according to claim 14, further comprising:
a linkage comprising a seating part on which the circuit parts are mounted; and
a plurality of links having first ends thereof hinge-coupled to the seating part and second ends hinge-coupled to respective divided plates.

16. The back plate according to claim 1, wherein the substrate forms a rear case that protects the flexible display and covers a back surface of the flexible display terminal.

17. A flexible display comprising the back plate of claim 1.

18. A flexible display terminal, comprising:
a flexible display deformable by an external force; and
a back plate arranged at a back surface of the flexible display, wherein the back plate comprises:
a substrate including a plurality of regions forming a plurality of divided plates that are configured to be displaced in response to deformation of the flexible display; and
a connection part formed of a flexible material, the connection part configured to connect adjacent divided plates of the plurality of divided plates with each other,
wherein the back plate further comprises a plurality of curved cut lines, each curved cut line extending along a curve toward a center of the back plate.

19. A back plate for a flexible display of a flexible display terminal, the back plate comprising:
a substrate;
a plurality of separation lines formed in the substrate;
a plurality of plates formed by the substrate, defined by the plurality of separation lines, each of the plurality of plates being configured to be displaced in response to deformation of the flexible display; and
a plurality of connection portions provided between the plurality of plates and configured to connect adjacent plates of the plurality of plates,
wherein the substrate is substantially rectangular and wherein the plurality of separation lines comprises a plurality of curved cut lines, each curved cut line extending toward a center of the back plate and connecting adjacent sides of a respective corner of the back plate.

20. The back plate according to claim 19, more than one curved cut line being oriented toward each corner of the substrate and being spaced apart from each other in an arrangement from the respective corner toward a center of the substrate.

21. The back plate according to claim 19, wherein the substrate is substantially rectangular, and wherein the plurality of divided plates comprises:
a center plate arranged in a center portion of the back plate and respectively defined by four curved cut lines corresponding to four corners of the substrate; and
a plurality of corner plates arranged outside of the center plate, each at a position corresponding to one of the four corners of the substrate.

22. The back plate according to claim 21, wherein the center plate is divided into a plurality of central plates by at least one horizontal cut line and at least one vertical cut line intersecting at a central portion thereof, and wherein one of the plurality of connection portions is provided between each pair of adjacent central plates.

23. A back plate for a display device, comprising:
a plurality of substrates coupled to each other to form a prescribed shape, wherein the plurality of substrates includes a first substrate and a second substrate which are adjacent to each other, edges of the first and second substrates facing each other forming a first curved contour on the surface of the plate, and
a first flexible connector attached to the faces of the first and second substrates, the flexible connector extending from a first point of a boundary of the back plate to a second point of the boundary of the back plate, and the first flexible connector follows the curved contour on the surface of the back plate formed by the first and second substrates.

24. The back plate according to claim 23, wherein the plurality of substrates further comprises:
   a third substrate adjacent to the second substrate, edges of the second and third substrate facing each other forming a second curved contour on the surface of the plate, and
   a second flexible member attached to the faces of the second and third substrates, the second flexible member extending from a third point of the boundary of the back plate to a fourth point of the boundary of the back plate, wherein the first point and third point are on a first side of the boundary of the back plate, and the second point and fourth point are on a second side of the boundary of the back plate, the first and second sides being different sides of the prescribed shape.

* * * * *